(12) United States Patent
Jagannathan et al.

(10) Patent No.: US 9,577,062 B2
(45) Date of Patent: Feb. 21, 2017

(54) DUAL METAL GATE ELECTRODE FOR REDUCING THRESHOLD VOLTAGE

(71) Applicants: International Business Machines Corporation, Armonk, NY (US); Renesas Electronics Corporation, Kanagawa (JP)

(72) Inventors: Hemanth Jagannathan, Guilderland, NY (US); Hiroshi Sunamura, Tokyo (JP)

(73) Assignees: International Business Machines Corporation, Armonk, NY (US); Renesas Electronics Corporation, Kanagawa (JP)

( * ) Notice: Subject to any disclaimer, the term of this patent is extended or adjusted under 35 U.S.C. 154(b) by 38 days.

(21) Appl. No.: 14/524,056

(22) Filed: Oct. 27, 2014

(65) Prior Publication Data

US 2016/0118470 A1    Apr. 28, 2016

(51) Int. Cl.
*H01L 29/49* (2006.01)
*H01L 21/28* (2006.01)
*H01L 29/78* (2006.01)
*H01L 29/51* (2006.01)
*H01L 29/66* (2006.01)

(52) U.S. Cl.
CPC ..... *H01L 29/4966* (2013.01); *H01L 21/28088* (2013.01); *H01L 21/28176* (2013.01); *H01L 29/6659* (2013.01); *H01L 29/66545* (2013.01); *H01L 29/7833* (2013.01); *H01L 29/517* (2013.01); *H01L 29/665* (2013.01)

(58) Field of Classification Search
CPC ... H01L 29/4966; H01L 29/517; H01L 29/518
USPC ......................................................... 438/303
See application file for complete search history.

(56) References Cited

U.S. PATENT DOCUMENTS

| | | | |
|---|---|---|---|
| 6,878,578 B1 * | 4/2005 | Twu | H01L 21/02052 257/288 |
| 7,776,687 B2 | 8/2010 | Kang et al. | |
| 7,999,323 B2 | 8/2011 | Cartier et al. | |
| 8,003,503 B1 | 8/2011 | Clark | |
| 2006/0237796 A1 * | 10/2006 | Cartier | H01L 21/823842 257/371 |
| 2010/0159684 A1 * | 6/2010 | Chang | H01L 21/823807 438/585 |

(Continued)

*Primary Examiner* — Kenneth Parker
*Assistant Examiner* — Warren H Kilpatrick
(74) *Attorney, Agent, or Firm* — Scully, Scott, Murphy & Presser, P.C.; Daniel Morris, Esq.

(57) ABSTRACT

A gate conductor material stack including, from bottom to top, of a first metallic nitride, a second metallic nitride, and a conductive material portion is employed for a transistor in combination with a gate dielectric including a high dielectric constant (high-k) dielectric material. The second metallic nitride includes a nitride of an aluminum-containing metallic alloy of at least two elemental metals, and can be selected from TaAlN, TiAlN, and WAlN. The second metallic nitride can provide a function of oxygen scavenging from the high-k gate dielectric and/or prevent diffusion of atoms from the conductive material portion. The gate conductor material stack can enable a reduced inversion thickness and/or a reduced magnitude for a linear threshold voltage for p-type field effect transistors compared with a gate electrode employing a single metallic material.

15 Claims, 6 Drawing Sheets

(56) References Cited

U.S. PATENT DOCUMENTS

| | | |
|---|---|---|
| 2011/0121397 A1 | 5/2011 | Pal et al. |
| 2011/0121401 A1 | 5/2011 | Park et al. |
| 2011/0175147 A1 | 7/2011 | Adusumilli et al. |
| 2011/0237063 A1 | 9/2011 | Kim et al. |
| 2011/0309449 A1 | 12/2011 | Ando et al. |
| 2012/0228773 A1 | 9/2012 | Brown et al. |
| 2012/0256276 A1* | 10/2012 | Hwang ........... H01L 21/823842 257/410 |
| 2013/0092992 A1 | 4/2013 | Chang et al. |
| 2013/0200467 A1* | 8/2013 | Edge ................. H01L 21/82345 257/392 |
| 2013/0221445 A1* | 8/2013 | Lei .................... H01L 21/28008 257/368 |

\* cited by examiner

DUAL METAL GATE ELECTRODE FOR REDUCING THRESHOLD VOLTAGE

BACKGROUND

The present disclosure generally relates to semiconductor devices, and particularly to a field effect transistor containing a composite gate electrode including a nitride of an aluminum-containing metallic alloy, and methods of manufacturing the same.

The scaling of a gate stack including a high dielectric constant (high-k) dielectric material and a metallic electrode has been limited by a correlation between an inversion thickness (Tinv) and a linear threshold voltage (Vtlin). The inversion thickness (Tinv) refers to the thickness of an equivalent thermal silicon oxide layer that provides the same incremental inversion charge density per gate voltage swing as the high-k dielectric material. The linear threshold voltage (Vtlin) is defined as a gate to source voltage that is needed to provide an areal source-to-drain current density of 300 nA×(W/L) at a drain-to-source voltage of 50 mV in an n-type field effect transistor that does not suffer from short channel effects, or a gate to source voltage that is needed to provide an areal source-to-drain current density of 90 nA× (W/L) at a drain-to-source voltage of 50 mV in a p-type field effect transistor that does not suffer from short channel effects. W refers to the width of the channel of the field effect transistor, and L refers to the length of the channel of the field effect transistor. For p-type field effect transistors, the more negative the linear threshold voltage, the lesser the inversion thickness of a combination of a high-k gate dielectric and a metallic gate electrode. A limit established by a correlation curve between the inversion thickness and the linear threshold voltage as established employing a $HfO_2$ high-k dielectric material and a TiN gate electrode has not been broken by any other combinations of high-k gate dielectric materials and metal gate materials so far.

SUMMARY

A gate conductor material stack including, from bottom to top, of a first metallic nitride, a second metallic nitride, and a conductive material portion is employed for a transistor in combination with a gate dielectric including a high dielectric constant (high-k) dielectric material. The second metallic nitride includes a nitride of an aluminum-containing metallic alloy of at least two elemental metals, and can be selected from TaAlN, TiAlN, and WAlN. The second metallic nitride can provide a function of oxygen scavenging from the high-k gate dielectric and/or prevent diffusion of atoms from the conductive material. The gate conductor material stack can enable a reduced inversion thickness and/or a reduced magnitude for a linear threshold voltage for p-type field effect transistors compared with a gate electrode employing a single metallic material.

According to an aspect of the present disclosure, a semiconductor structure includes a semiconductor material portion, which includes a body region, a source region contacting one side of the body region, and a drain region contacting another side of the body region. A gate dielectric contacts a surface of the body region. A gate electrode includes a stack, from bottom to top, of a first metallic nitride layer, a second metallic nitride layer, and a conductive material portion on the gate dielectric. The first metallic nitride layer includes a first conductive material that is a conductive nitride of a single elemental metal, and the second metallic nitride layer includes a second conductive material that is a conductive nitride of an aluminum-containing intermetallic compound.

According to another aspect of the present disclosure, a method of forming a semiconductor structure is provided. A gate dielectric is formed on a semiconductor material portion. A gate electrode is formed, which includes a stack, from bottom to top, of a first metallic nitride layer, a second metallic nitride layer, and a conductive material portion on the gate dielectric. The first metallic nitride layer includes a first conductive material that is a conductive nitride of a single elemental metal, and the second metallic nitride layer includes a second conductive material that is a conductive nitride of an aluminum-containing intermetallic compound.

In one embodiment, the gate dielectric can be a planar gate dielectric consisting of a horizontal gate dielectric portion having a uniform thickness throughout the entirety thereof, the first metallic nitride layer can be a first planar metallic layer consisting of a first horizontal metallic nitride portion having a first uniform thickness throughout the entirety thereof, and the second metallic nitride layer can be a second planar metallic layer consisting of a second horizontal metallic nitride portion having a second uniform thickness throughout the entirety thereof.

In another embodiment, the gate dielectric can be a "U-shaped" gate dielectric including a horizontal gate dielectric portion and vertical gate dielectric portions vertically extending upward from the entire periphery of the horizontal gate dielectric portion up to the height of a top surface of a planarization dielectric layer, the first metallic nitride layer can be a first "U-shaped" metallic layer including a first horizontal metallic nitride portion and first vertical metallic nitride portions vertically extending upward from the entire periphery of the first horizontal metallic nitride portion up to the height of the top surface of the planarization dielectric layer, and the second metallic nitride layer can be a second "U-shaped" metallic layer including a second horizontal metallic nitride portion and second vertical metallic nitride portions vertically extending upward from the entire periphery of the first horizontal metallic nitride portion up to the height of the top surface of the planarization dielectric layer.

DETAILED DESCRIPTION

Figure 1:
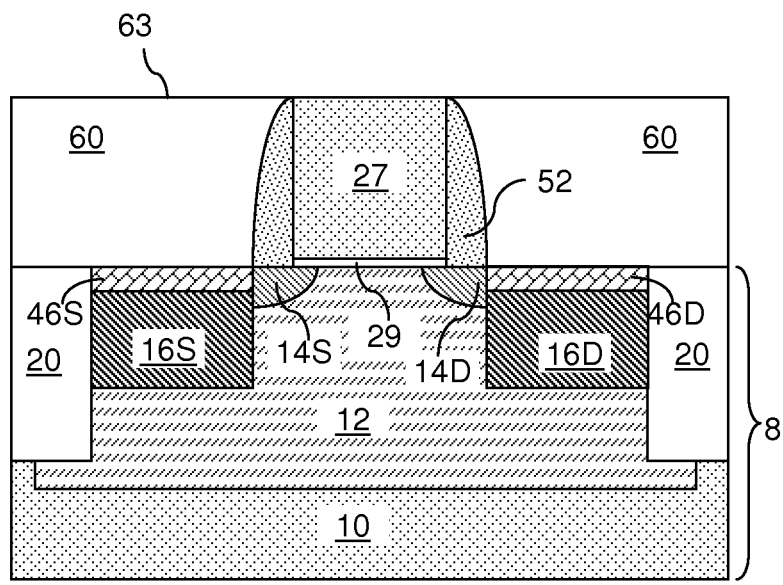
FIG. 1 is vertical cross-sectional view of a first exemplary semiconductor structure after formation of a disposable gate structure, source and drain regions, and a planarization dielectric layer according to a first embodiment of the present disclosure.

As stated above, the present disclosure relates to a field effect transistor containing a composite gate electrode including a nitride of an aluminum-containing metallic alloy, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to an embodiment of the present disclosure includes a semiconductor substrate 8, on which various components of a field effect transistor are subsequently formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10 and a doped well 12 having opposite types of doping to provide device isolation for devices to be formed on the doped well 12.

Shallow trench isolation structures 20 can be formed to laterally separate multiple devices. If the semiconductor substrate 8 is a semiconductor-on-insulator substrate, a bottom surfaces of the doped well 12 may contact a buried insulator layer (not shown), which electrically isolates the doped well 12 from other semiconductor portions of the semiconductor substrate 8 in conjunction with the shallow trench isolation structures 20. Topmost surfaces of the shallow trench isolation structures 20 can be substantially coplanar with, located above, or located below topmost surfaces of the doped well 12.

Disposable gate level layers are deposited on the semiconductor substrate 8 as blanket layers, i.e., as unpatterned contiguous layers. The disposable gate level layers can include, for example, a vertical stack of a disposable gate dielectric layer and a disposable gate material layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed.

The disposable gate level layers are lithographically patterned to form a disposable gate structure. For example, a photoresist (not shown) can be applied over the topmost surface of the disposable gate level layers, and can be lithographically patterned by lithographic exposure and development. The pattern in the photoresist is transferred into the disposable gate level layers by an etch, which can be an anisotropic etch such as a reactive ion etch. The remaining portions of the disposable gate level layers after the pattern transfer constitute the disposable gate structure.

The disposable gate stacks may include, for example, a disposable gate dielectric portion 29 and a disposable gate material portion 27. The disposable gate material portion 27 is a remaining portion of the disposable gate material layer. The disposable gate dielectric portion 29 is a remaining portion of the disposable gate dielectric layer.

Ion implantations can be employed to form various source/drain extension regions. For example, electrical dopants can be implanted into portions of the doped well 12 that are not covered by the disposable gate structure (29, 27) to form a source extension region 14S and a drain extension region 14D. The electrical dopants can be p-type dopants or n-type dopants.

A gate spacer 52 is formed on sidewalls of the disposable gate structure (29, 27), for example, by deposition of a conformal dielectric material layer and an anisotropic etch.

A source region 16S and a drain region 16D can be formed, for example, by implanting electrical dopants, which can be p-type dopants or n-type dopants. Ion implantation can be employed to form the source region 16S and the drain region 16D. Alternately, the source region 16S and the drain region 16D can be formed by substituting physically exposed upper portions of the doped well 12 with stress-generating semiconductor materials such as a silicon-germanium alloy or a silicon-carbon alloy. The embedded stress-generating semiconductor materials can be epitaxially aligned to the remaining portions of the doped well 12. The remaining portion of the doped well 12 after formation of the source region 16S and the drain region 12D is a body region of a field effect transistor to be formed.

A source-side metal semiconductor alloy portion 46S and a drain-side metal semiconductor alloy portion 46D can be formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the source-side metal semiconductor alloy portion 46S and the drain-side metal semiconductor alloy portion 46D, which can include a metal silicide portions if the semiconductor material of the source region 16S and the drain region 16D include silicon.

A planarization dielectric layer 60 can be deposited over the metal semiconductor alloy portions (46S, 46D), the disposable gate structure (29, 27), and the gate spacer 52. In one embodiment, the planarization dielectric layer 60 is a dielectric material that may be easily planarized. For example, the planarization dielectric layer 60 can be a doped silicate glass or an undoped silicate glass (silicon oxide).

The planarization dielectric layer 60 is planarized employing the disposable gate material portion 27 as a stopping structure. The planarization can be performed, for example, by chemical mechanical planarization (CMP). The planar topmost surface of the planarization dielectric layer 60 is herein referred to as a planar dielectric surface 63. The topmost surface of the disposable gate structure (29, 27) can be coplanar with the planar dielectric surface 63 after the planarization.

Figure 2:
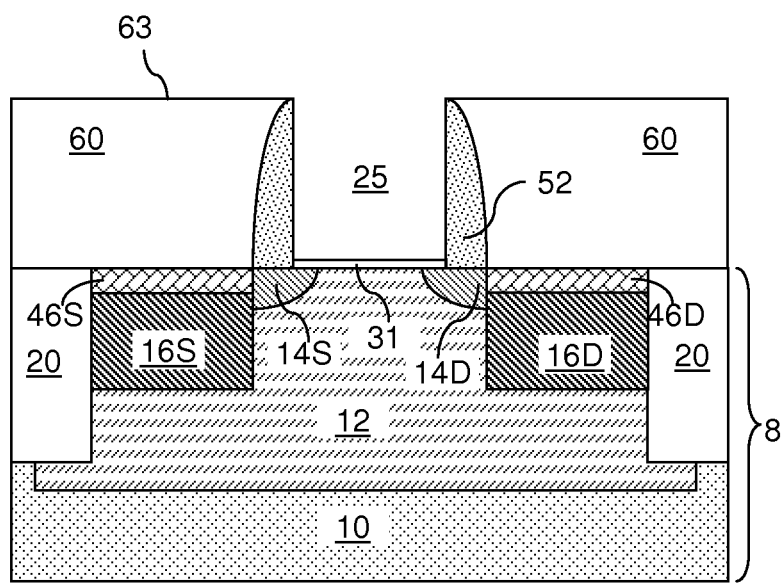
FIG. 2 is a vertical cross-sectional view of the first exemplary semiconductor structure after removal of the disposable gate structure according to the first embodiment of the present disclosure.

Referring to FIG. 2, the disposable gate structure (29, 27) is removed by at least one etch. The disposable gate structure (29, 27) can be removed, for example, by at least one etch, which can include an anisotropic etch, an isotropic etch, or a combination thereof. The at least one etch can include a dry etch and/or a wet etch. The at least one etch employed to remove the disposable gate structure (29, 27) can be selective to the dielectric materials of the planarization dielectric layer 60 and any other dielectric material layer that is present above the semiconductor substrate 8.

A gate cavity 25 is formed in the volume from which the disposable gate structure (29, 27) is removed. A semiconductor surface of the body region, i.e., the top surface of the doped well 12, is exposed at the bottom of the gate cavity 25. The gate cavity 25 is laterally surrounded by the planarization dielectric layer 60. The gate spacer 52 laterally surrounds the gate cavity 25. The inner sidewalls of the gate spacer 52 can be substantially vertical, and extends from the top surface of the body region to the planar dielectric surface 63, i.e., the topmost surface, of the planarization dielectric layer 60.

A chemical oxide layer 31 can be formed on the top surface of the body region, i.e., on the top surface of the doped well 12. The chemical oxide layer 31 includes a chemical oxide of the semiconductor material of the doped well. As used herein, a "chemical oxide" refers to an oxide material that is formed by conversion of an underlying material into an oxide by a chemical. For example, if the doped well 12 includes silicon, the chemical oxide layer 31 includes silicon oxide. If the doped well 12 includes a silicon-containing semiconductor material, the doped well 12 includes an oxide of a semiconductor material and includes silicon as a constituent atom. The thickness of the chemical oxide layer 31 can be in a range from 0.3 nm to 1.0 nm, although lesser and greater thicknesses can also be employed.

Figure 3:
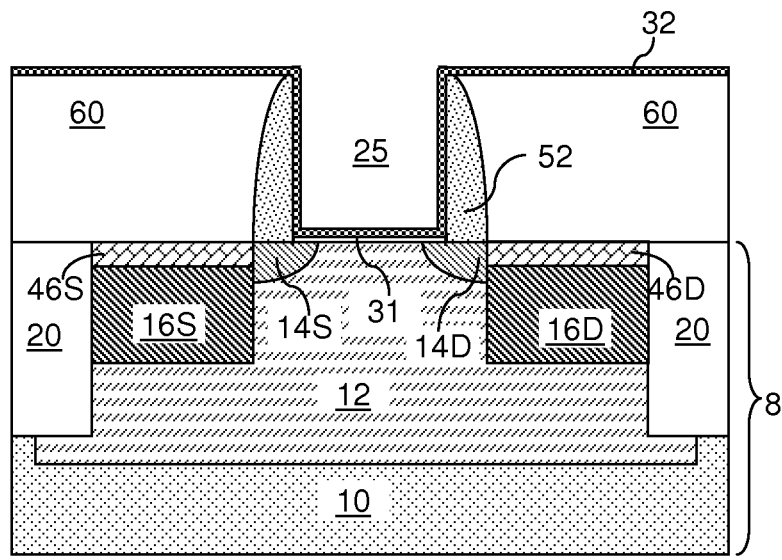
FIG. 3 is a vertical cross-sectional view of the first exemplary semiconductor structure after formation of a gate dielectric layer according to the first embodiment of the present disclosure.

Referring to FIG. 3, a gate dielectric layer 32 is deposited on the bottom surfaces and sidewalls of the gate cavity 25 and the topmost surface of the planarization dielectric layer 60. The gate dielectric layer 32 can be a high dielectric constant (high-k) material layer having a dielectric constant greater than 3.9. The gate dielectric layer 32 can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32, as measured at horizontal portions, can be from 0.9 nm to 6 nm, and preferably from 1.0 nm to 3 nm. The gate dielectric layer 32 may have an effective oxide thickness on the order of or less than 2 nm. In one embodiment, the gate dielectric layer 32 is a hafnium oxide ($HfO_2$) layer.

Figure 4:
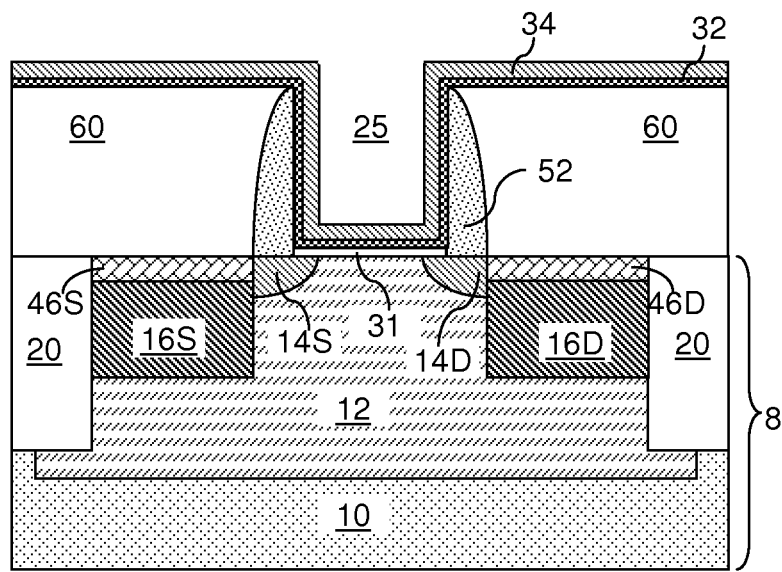
FIG. 4 is a vertical cross-sectional view of the first exemplary semiconductor structure after deposition of a first metallic nitride layer according to the first embodiment of the present disclosure.

Referring to FIG. 4, a first metallic nitride layer 34 is deposited directly on the physically exposed surfaces of the gate dielectric layer 32. The first metallic nitride layer 34 includes a conductive nitride of a single elemental metal. As used herein, a conductive nitride refers to a nitride material having a resistivity less than $1.0 \times 10^{-3}$ Ohm-cm. For example, the first metallic nitride layer 34 can include a material selected from TiN, TaN, and WN.

The first metallic nitride layer 34 can be deposited, for example, by physical vapor deposition (PVD) or by atomic layer deposition (ALD). In this case, the first metallic nitride layer 34 can consist essentially of nitrogen and a single elemental metal. The atomic concentration of the elemental metal in the first metallic nitride layer 34 can be in a range from 40% to 60%, and the balance of the composition can be nitrogen atoms. The thickness of the first metallic nitride layer 34 can be in a range from 2 nm to 30 nm, although lesser and greater thicknesses can also be employed.

Figure 5:
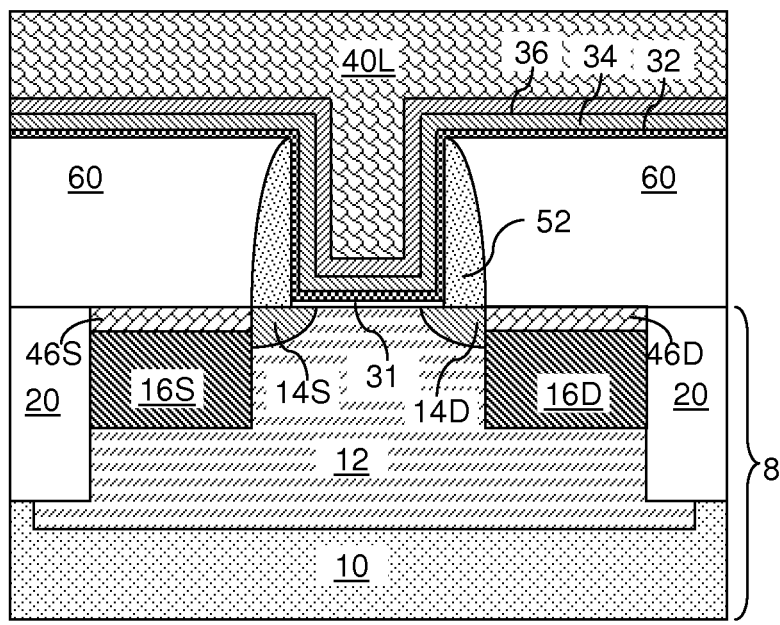
FIG. 5 is a vertical cross-sectional view of the first exemplary semiconductor structure after deposition of a second metallic nitride layer and a conductive material layer according to the first embodiment of the present disclosure.

Referring to FIG. 5, a second metallic nitride layer 36 is deposited on the first metallic nitride layer 34. The second metallic nitride layer 36 includes a conductive nitride of an aluminum-containing intermetallic compound. As used herein, an intermetallic compound refers to a compound consisting of at least two elemental metals. An aluminum-containing intermetallic compound refers to an intermetallic compound in which one of the constituent element is aluminum. The conductive nitride of the aluminum-containing intermetallic compound includes nitrogen, aluminum, and at least one elemental metal. In one embodiment, the conductive nitride of the aluminum-containing intermetallic compound consists essentially of nitrogen, aluminum, and at least one elemental metal.

In one embodiment, the second metallic nitride layer 36 consists essentially of nitrogen, aluminum, and a transition metal element. In one embodiment, the second metallic nitride layer 36 includes aluminum at an atomic concentration in a range from 10% to 30%. In one embodiment, the conductive nitride of the aluminum-containing intermetallic compound of the second metallic nitride layer 36 can be selected from TaAlN, TiAlN, and WAlN among others. In one embodiment, the first metallic nitride layer 34 can include TiN, and the second metallic nitride layer 36 can include TaAlN.

The second metallic nitride layer 36 can be deposited, for example, by physical vapor deposition (PVD) or by atomic layer deposition (ALD). The atomic concentration of the nitrogen in the second metallic nitride layer 36 can be in a range from 40% to 60%. The thickness of the second metallic nitride layer 36 can be in a range from 2 nm to 6 nm, although lesser and greater thicknesses can also be employed.

A conductive material layer 40L is subsequently deposited on the second metallic nitride layer 36. The conductive material layer 40L can include a doped semiconductor material, a metallic material, or a combination thereof. In one embodiment, the conductive material layer 40L can include a material selected from tungsten, cobalt, aluminum, alloys thereof, and stacks thereof. In another embodiment, the conductive material layer 40L can include a material selected from doped silicon, a doped silicon-germanium alloy, a doped silicon-carbon alloy, and a doped silicon-germanium-carbon alloy. The conductive material layer 40 can be deposited, for example, by chemical vapor deposition (CVD), physical vapor deposition (PVD), atomic layer deposition (ALD), or a combination thereof. The conductive material layer 40L fills a remaining portion of the gate cavity 25. The thickness of the conductive material layer 40L, as measured above the top surface of the planarization dielectric layer 60, can be in a range from 20 nm to 300 nm, although lesser and greater thicknesses can also be employed.

Figure 6:
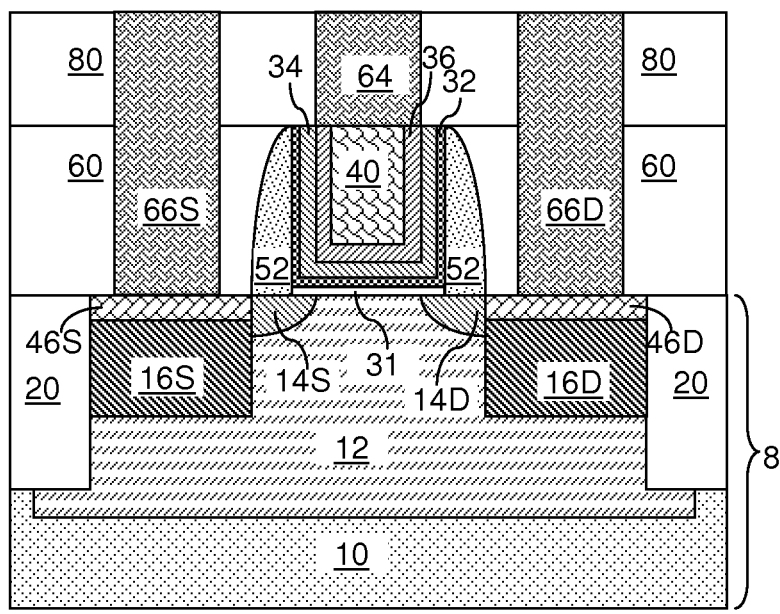
FIG. 6 is a vertical cross-sectional view of the first exemplary semiconductor structure after formation of a gate electrode and contact via structures according to the first embodiment of the present disclosure.

Referring to FIG. 6, the portions of the conductive material layer 40L, the second metallic nitride layer 36, the first metallic nitride layer 34, and the gate dielectric layer 32 located above the top surface of the planarization dielectric layer 60 are removed, for example, by chemical mechanical planarization. The remaining portions of the conductive material layer 40L, the second metallic nitride layer 36, and the first metallic nitride layer 34 collectively constitute a gate electrode (34, 36, 40). The remaining portion of the conductive material layer 40L is herein referred to as a conductive material portion 40. The remaining portion of the gate dielectric layer 32 and the chemical oxide layer collectively constitute a gate dielectric (31, 32). The gate dielectric layer 32 includes a horizontal portion and vertical portions. The horizontal portion of the gate dielectric layer 32 and the vertical portions of the gate dielectric layer 32 can have the same thickness. The gate dielectric (31, 32) is formed directly on the doped well 12, which is a semiconductor material portion.

The gate electrode (34, 36, 40) includes a stack, from bottom to top, of the first metallic nitride layer 34, the second metallic nitride layer 36, and the conductive material portion 40 that is located on the gate dielectric (31, 32). The gate dielectric (31, 32) and the gate electrode (34, 36, 40) collectively constitute a gate stack (31, 32, 34, 36, 40).

In another embodiment, the gate dielectric (31, 32) can be a "U-shaped" gate dielectric including a horizontal gate dielectric portion and vertical gate dielectric portions vertically extending upward from the entire periphery of the horizontal gate dielectric portion up to the height of a top surface of the planarization dielectric layer 60, the first metallic nitride layer 34 can be a first "U-shaped" metallic layer including a first horizontal metallic nitride portion and first vertical metallic nitride portions vertically extending upward from the entire periphery of the first horizontal metallic nitride portion up to the height of the top surface of the planarization dielectric layer 60, and the second metallic nitride layer 36 can be a second "U-shaped" metallic layer including a second horizontal metallic nitride portion and second vertical metallic nitride portions vertically extending upward from the entire periphery of the first horizontal metallic nitride portion up to the height of the top surface of the planarization dielectric layer 60.

A contact-level dielectric layer 80 can be deposited over the planarization dielectric layer 60. The contact-level dielectric layer 80 includes a dielectric material such as silicon oxide, silicon nitride, porous organosilicate glass (OSG), and/or non-porous OSG. Various contact via structures can be formed through the planarization dielectric layer 60 and the contact-level dielectric layer 80. The various contact via structures can include, for example, a source-side contact via structure 66S, a drain-side contact via structure 66D, and a gate-side contact via structure 64.

Figure 7:
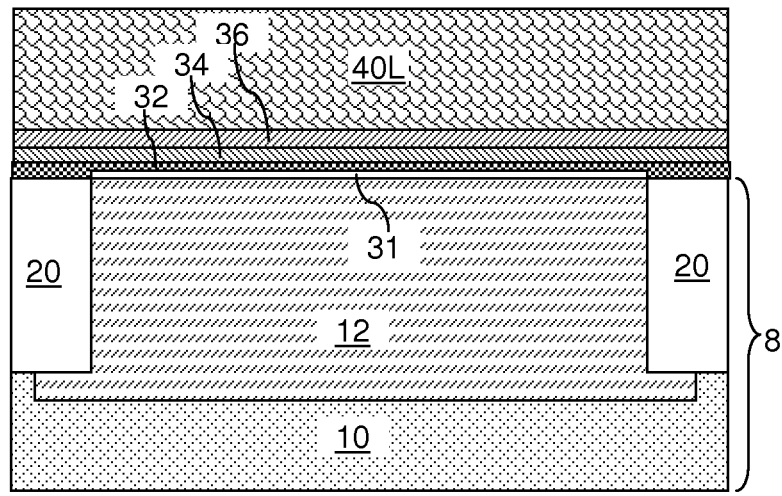
FIG. 7 is a vertical cross-sectional view of a second exemplary semiconductor structure after formation of gate level layers according to a second embodiment of the present disclosure.

Referring to FIG. 7, a second exemplary semiconductor structure according to a second embodiment of the present disclosure is illustrated. The second exemplary semiconductor structure can be formed, for example, by forming a doped well 12 and shallow trench isolation structures 20 in a substrate 8 in the same manner as in the first embodiment, and by forming a chemical oxide layer 31, a gate dielectric layer 32, a first metallic nitride layer 34, a second metallic nitride layer 36, and a conductive material layer 40L as planar layers. As used herein, a "planar" layer refers to a blanket material layer without patterning or without topographical variation in the height of the top surface of the layer by a vertical distance that exceeds the thickness of the layer. The same processing steps can be employed as in the first embodiment to form each of the chemical oxide layer 31, the gate dielectric layer 32, the first metallic nitride layer 34, the second metallic nitride layer 36, and the conductive material layer 40L.

Figure 8:
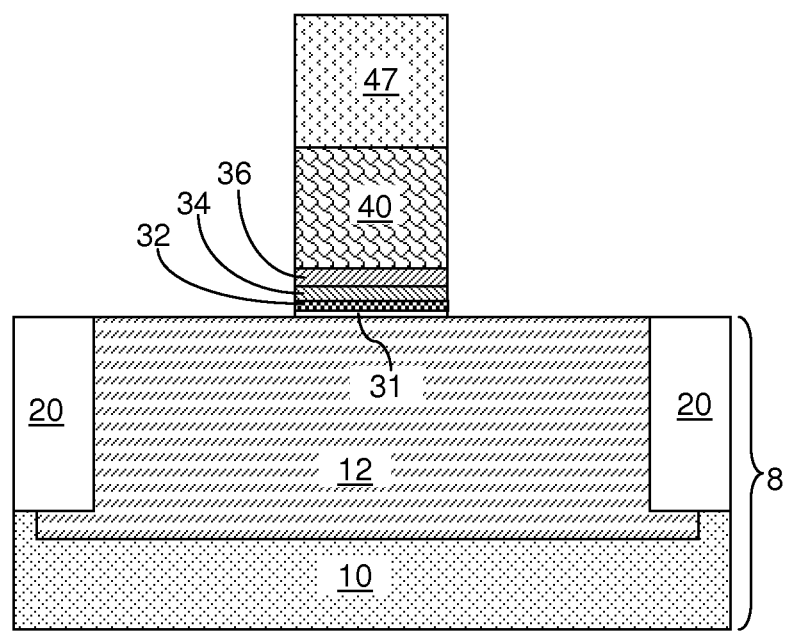
FIG. 8 is a vertical cross-sectional view of the second exemplary semiconductor structure after formation of a gate stack according to the second embodiment of the present disclosure.

Referring to FIG. 8, a photoresist layer 47 is applied and lithographically patterned over the stack of the chemical oxide layer 31, the gate dielectric layer 32, the first metallic nitride layer 34, the second metallic nitride layer 36, and the conductive material layer 40L to cover areas in which a gate electrode is to be subsequently patterned. The pattern in the photoresist layer 47 is transferred through the stack of the chemical oxide layer 31, the gate dielectric layer 32, the first metallic nitride layer 34, the second metallic nitride layer 36, and the conductive material layer 40L by at least one etch. For example, at least one anisotropic etch can be employed to pattern the conductive material layer 40L, the second metallic nitride layer 36, and the first metallic nitride layer 34 employing the photoresist layer 47 as an etch mask. The gate dielectric layer 32 and the chemical oxide layer 31 can be patterned, for example, by an anisotropic etch and/or an isotropic etch. The remaining portion of the chemical oxide layer 31 and the gate dielectric layer 32 constitutes a gate dielectric (31, 32), and the remaining portions of the first metallic nitride layer 34, the second metallic nitride layer 36, and the conductive material layer 40L collectively constitute a gate electrode (34, 36, 40). The remaining portion of the conductive material layer 40L is herein referred to as a conductive material portion 40. The gate dielectric (31, 32) and the gate electrode (34, 36, 40) collectively constitute a gate stack (31, 32, 34, 36, 40).

Figure 9:
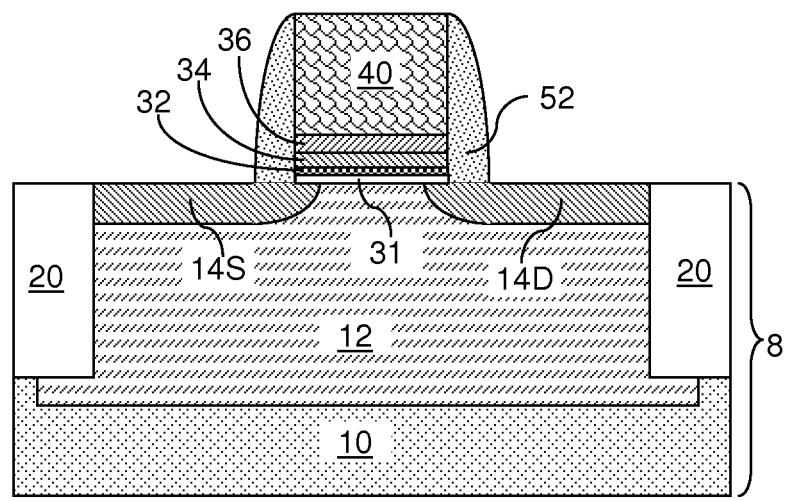
FIG. 9 is a vertical cross-sectional view of the second exemplary semiconductor structure after formation of a gate spacer and source and drain extension regions according to the second embodiment of the present disclosure.

Referring to FIG. 9, a source extension region 14S and a drain extension region 14D can be formed, for example, by ion implantation of electrical dopants in which the gate stack (31, 32, 34, 36, 40) is employed as an implantation mask.

In one embodiment, the gate dielectric (31, 32) can be a planar gate dielectric consisting of a horizontal gate dielectric portion having a uniform thickness throughout the entirety thereof, the first metallic nitride layer 34 can be a first planar metallic layer consisting of a first horizontal metallic nitride portion having a first uniform thickness throughout the entirety thereof, and the second metallic nitride layer 36 can be a second planar metallic layer consisting of a second horizontal metallic nitride portion having a second uniform thickness throughout the entirety thereof.

A gate spacer 52 is formed on sidewalls of the disposable gate structure (29, 27), for example, by deposition of a conformal dielectric material layer and an anisotropic etch.

Figure 10:
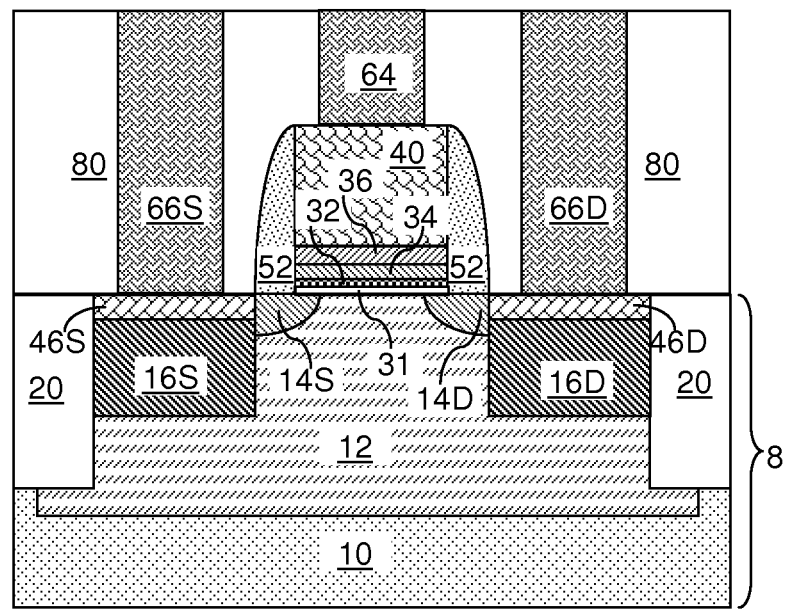
FIG. 10 is a vertical cross-sectional view of the second exemplary semiconductor structure after formation of a contact-level dielectric layer and contact via structures according to the second embodiment of the present disclosure.

Referring to FIG. 10, a source region 16S and a drain region 16D can be formed, for example, by implanting electrical dopants, which can be p-type dopants or n-type dopants. Ion implantation can be employed to form the source region 16S and the drain region 16D. Alternately, the source region 16S and the drain region 16D can be formed by substituting physically exposed upper portions of the doped well 12 with stress-generating semiconductor materials such as a silicon-germanium alloy or a silicon-carbon alloy. The embedded stress-generating semiconductor materials can be epitaxially aligned to the remaining portions of the doped well 12. The remaining portion of the doped well 12 after formation of the source region 16S and the drain region 12D is a body region of a field effect transistor to be formed.

A source-side metal semiconductor alloy portion 46S and a drain-side metal semiconductor alloy portion 46D can be formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the source-side metal semiconductor alloy portion 46S and the drain-side metal semiconductor alloy portion 46D, which can include a metal silicide portions if the semiconductor material of the source region 16S and the drain region 16D include silicon.

A contact-level dielectric layer 80 can be deposited over the gate stack (31, 32, 34, 36, 40), the gate spacer 52, and the metal semiconductor alloy portions (46S, 46D). The contact-level dielectric layer 80 includes a dielectric material such as silicon oxide, silicon nitride, porous organosilicate glass (OSG), and/or non-porous OSG. Various contact via structures can be formed through the planarization dielectric layer 60 and the contact-level dielectric layer 80. The various contact via structures can include, for example, a source-side contact via structure 66S, a drain-side contact via structure 66D, and a gate-side contact via structure 64.

In one embodiment, each of the first semiconductor structure and the second semiconductor structure can be employed as a p-type field effect transistor in which the source region 16S, the drain region 16D, the source extension region 14S, and the drain extension region 14D are doped with p-type dopants, and the body region of the doped well 12 is intrinsic or doped with n-type dopants. In this case, the presence of the second metallic nitride layer 36 between the first metallic nitride layer 34 and the conductive material portion 40 modifies the work function of a comparative exemplary electrode in which a single metallic material that is in direct contact with a gate dielectric and a conductive material layer.

Figure 11:
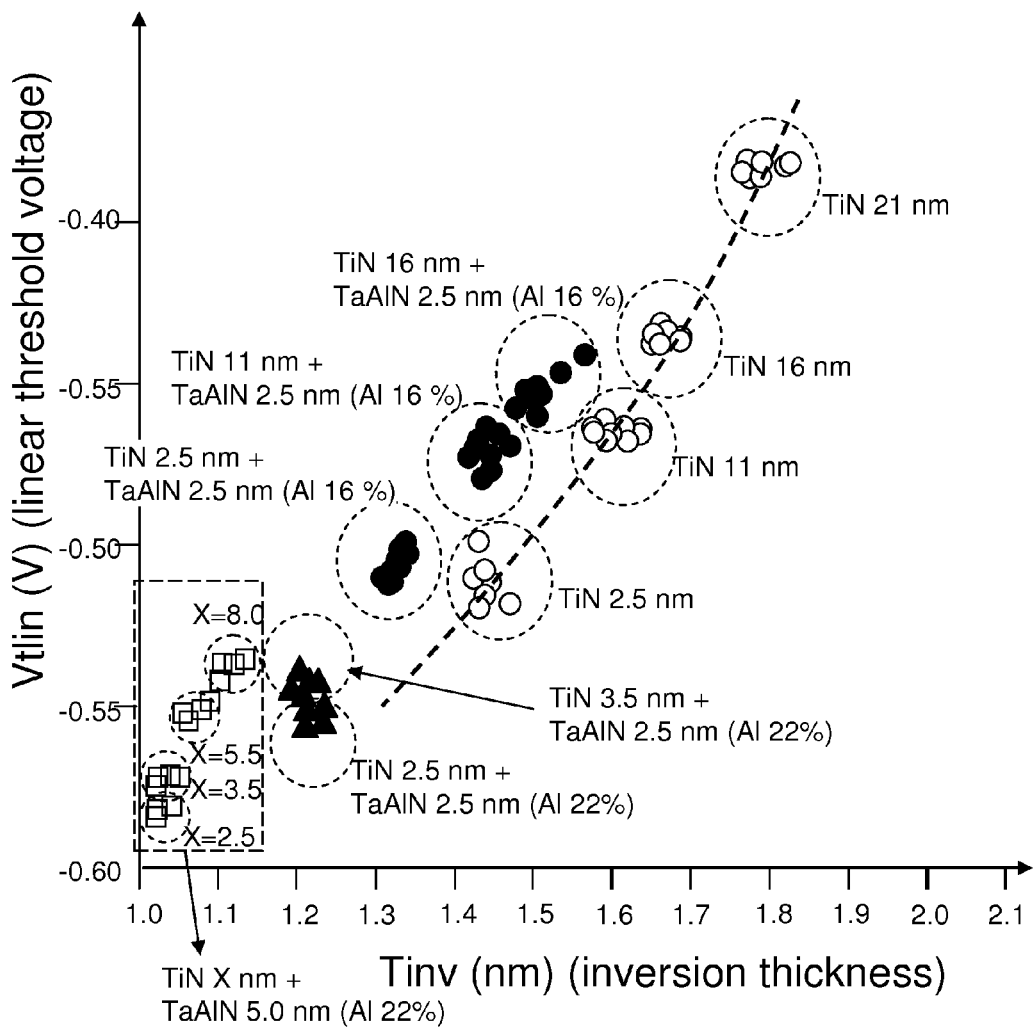
FIG. 11 is graph of the inversion thickness versus the linear threshold voltage of a p-type field effect transistor employing a high-k gate dielectric and various types of metallic materials for the metallic portion of a gate electrode.

Referring FIG. 11, a graph of the inversion thickness versus the linear threshold voltage of a p-type field effect transistor is shown for various types of gate electrodes. Data points labeled "TiN 2.5 nm," "TiN 11 nm," "TiN 16 nm," and "TiN 21 nm" refer to comparative exemplary p-type field effect transistors including gate electrodes in which the metallic material portion in contact with a gate dielectric and a doped semiconductor material layer consists of 2.5 nm thick TiN, 11 nm thick TiN, 16 nm thick TiN, and 21 nm thick TiN, respectively. Data points labeled "TiN 2.5 nm+TaAlN 2.5 nm (Al 16%)," "TiN 11 nm+TaAlN 2.5 nm (Al 16%)," and "TiN 16 nm+TaAlN 2.5 nm (Al 16%)" refer to p-type field effect transistors including gate electrodes containing a stack of a 2.5 nm thick TiN and 2.5 nm thick TaAlN containing 16% of Al in atomic concentration, a stack of a 11 nm thick TiN and 2.5 nm thick TaAlN containing 16% of Al in atomic concentration, or a stack of a 16 nm thick TiN and 2.5 nm thick TaAlN containing 16% of Al in atomic concentration, respectively, according to the first embodiment of the present disclosure. Data points labeled "TiN 2.5 nm+TaAlN 2.5 nm (Al 33%)" and "TiN 3.5 nm+TaAlN 2.5 nm (Al 22%)" refer to p-type field effect transistors including gate electrodes containing a stack of a 2.5 nm thick TiN and 2.5 nm thick TaAlN containing 22% of Al in atomic concentration, or a stack of a 3.5 nm thick TiN and 2.5 nm thick TaAlN containing 22% of Al in atomic concentration, respectively, according to the first embodiment of the present disclosure. Data points labeled "X=2.5," "X=3.5," "X=5.5," and "X=8.0" refer to p-type field effect transistors including gate electrodes containing a stack of a 2.5 nm thick TiN and 5.0 nm thick TaAlN containing 22% of Al in atomic concentration, a stack of a 3.5 nm thick TiN and 5.0 nm thick TaAlN containing 22% of Al in atomic concentration, a stack of a 5.5 nm thick TiN and 5.0 nm thick TaAlN containing 22% of Al in atomic concentration, or a stack of a 8.0 nm thick TiN and 5.0 nm thick TaAlN containing 22% of Al in atomic concentration, respectively, according to the first embodiment of the present disclosure. For all devices represented in FIG. 11, the gate dielectric included a high-k gate dielectric material.

The dotted curve passing through the data points for the comparative exemplary p-type field effect transistors including gate electrodes in which the metallic material portion in contact with a gate dielectric and a doped semiconductor material layer consists of 2.5 nm thick TiN, 11 nm thick TiN, 16 nm thick TiN, and 21 nm thick TiN refer to the limits previously achievable for a p-type field effect transistor. Specifically, data points for a pair of an inversion thickness and a linear threshold voltage for any p-type field effect known in the art either fall on the dotted line or in a region located at the right side of the line. Particularly, gate electrodes for a p-type field effect transistor including a stack of a p-type work function material layer and an n-type work function material layer generate data points to the right of the dotted curve of FIG. 11.

In contrast, the exemplary structures according to the embodiments of the present disclosure can reduce the magnitude of the liner threshold voltage relative to the dotted line and/or reduce the inversion thickness relative to the dotted line. Thus, the structures of the various embodiments of the present disclosure can provide a superior performance for p-type field effect transistors relative to prior art field effect transistors known in the art.

Without wishing to be bound by any particular theory, it is conjectured that the first metallic nitride layer 34 functions as an efficient diffusion barrier layer that prevents the direct impact of the second metallic nitride layer 36 on the electrical properties of the high-k gate dielectric material of the gate dielectric. Thus, the work function of the p-type field effect transistors of the present disclosure is determined primarily by the work function of the first metallic nitride layer 34. At the same time, the second metallic nitride layer 36 functions as a good conduit of oxygen that passes through the first metallic nitride layer 34 during an anneal process. Thus, any oxygen atom transported into the second metallic nitride layer 36 can easily diffuse into the conductive material portion 40 and combine with the semiconductor material of the conductive material portion 40. Thus, the second metallic nitride layer 36 provides a scavenging effect without significantly disturbing the work function of the first metallic nitride layer 34. It is believed that the scavenging effect that minimizes the effect of the presence of the second metallic nitride layer enables shifting of the correlation between the linear threshold voltage and the inversion thickness. Further, it is conjectured that the presence of a significant amount of aluminum within the second metallic nitride layer 34 is responsible for the minimal impact of the second metallic nitride layer in increasing the inversion thickness or increasing the magnitude of the linear threshold voltage.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A semiconductor structure comprising:
   a semiconductor material portion including a body region, a source region contacting one side of said body region, and a drain region contacting another side of said body region;
   a gate dielectric contacting a surface of said body region; and
   a gate electrode comprising a stack, from bottom to top, of a first metallic nitride layer, a second metallic nitride layer, and a conductive material portion on said gate dielectric, wherein said first metallic nitride layer comprises TiN, and said second metallic nitride layer comprises TaAlN.

2. The semiconductor structure of claim 1, wherein said gate dielectric comprises a dielectric material having a dielectric constant greater than 8.0.

3. The semiconductor structure of claim 1, wherein said conductive material portion comprises a material selected from tungsten, cobalt, aluminum, doped silicon, a doped silicon-germanium alloy, a doped silicon-carbon alloy, and a doped silicon-germanium-carbon alloy.

4. The semiconductor structure of claim 1, wherein said second metallic nitride layer consists essentially of nitrogen, aluminum, and tantaluma.

5. The semiconductor structure of claim 1, wherein said second metallic nitride layer comprises aluminum at an atomic concentration in a range from 10% to 30%.

6. The semiconductor structure of claim 1, wherein said semiconductor structure comprises a p-type field effect transistor.

7. A method of forming a field effect transistor comprising:
   forming a gate dielectric on a semiconductor material portion; and
   forming a gate electrode comprising a stack, from bottom to top, of a first metallic nitride layer, a second metallic nitride layer, and a conductive material portion on said gate dielectric, wherein said first metallic nitride layer comprises TiN, and said second metallic nitride layer comprises TaAlN.

8. The method of claim 7, wherein said gate dielectric comprises a dielectric material having a dielectric constant greater than 8.0.

9. The method of claim 7, wherein said conductive material portion comprises a material selected from tungsten, cobalt, aluminum, doped silicon, a doped silicon-germanium alloy, a doped silicon-carbon alloy, and a doped silicon-germanium-carbon alloy.

10. The method of claim 7, wherein said second metallic nitride layer consists essentially of nitrogen, aluminum, and tantaluma.

11. The method of claim 7, wherein said second metallic nitride layer comprises aluminum at an atomic concentration in a range from 10% to 30%.

12. The method of claim 7, further comprising scavenging oxygen from said gate dielectric by annealing said gate electrode, wherein oxygen diffusing through said first metallic nitride layer during an anneal is captured by said conductive nitride of said aluminum-containing intermetallic compound.

13. The semiconductor structure of claim 1, wherein said gate dielectric comprises a stack, from bottom to top, of a chemical oxide layer and a gate dielectric layer.

14. The semiconductor structure of claim 13, wherein a bottommost surface of said chemical oxide layer is in direct contact with a topmost planar surface of said body region.

15. The method of claim 7, wherein said forming said gate dielectric further comprises forming a chemical oxide layer on a topmost planar surface of said body region, and forming a gate dielectric layer on a topmost surface of said chemical oxide layer.

* * * * *